(12) United States Patent
Wakabayashi

(10) Patent No.: US 12,416,082 B2
(45) Date of Patent: Sep. 16, 2025

(54) PROCESSING METHOD AND SUBSTRATE PROCESSING SYSTEM

(71) Applicant: Tokyo Electron Limited, Tokyo (JP)

(72) Inventor: Satoshi Wakabayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 205 days.

(21) Appl. No.: 17/596,693

(22) PCT Filed: May 21, 2020

(86) PCT No.: PCT/JP2020/020191
§ 371 (c)(1),
(2) Date: Dec. 16, 2021

(87) PCT Pub. No.: WO2020/255619
PCT Pub. Date: Dec. 24, 2020

(65) Prior Publication Data
US 2022/0316067 A1 Oct. 6, 2022

(30) Foreign Application Priority Data

Jun. 19, 2019 (JP) ................................. 2019-114040

(51) Int. Cl.
*C23C 16/52* (2006.01)
*C23C 16/448* (2006.01)
*C23C 16/455* (2006.01)

(52) U.S. Cl.
CPC .......... *C23C 16/52* (2013.01); *C23C 16/4481* (2013.01); *C23C 16/45544* (2013.01)

(58) Field of Classification Search
CPC ........................... C23C 16/4481; C23C 16/52
See application file for complete search history.

(56) References Cited

U.S. PATENT DOCUMENTS

2004/0007180 A1* 1/2004 Yamasaki ........... C23C 16/4481
118/715
2004/0015300 A1* 1/2004 Ganguli ................. C23C 16/52
702/24

(Continued)

FOREIGN PATENT DOCUMENTS

JP H04-36469 A 2/1992
JP H06-145992 A 5/1994

(Continued)

*Primary Examiner* — Joseph A Miller, Jr.
(74) *Attorney, Agent, or Firm* — Armstrong Teasdale LLP

(57) ABSTRACT

A processing method is implemented in a substrate processing system. The system includes: a processing container including a stage on which a substrate is placed; an attachment portion to which a raw material container is detachably attached; a heater configured to produce a raw material gas; a carrier gas supplier configured to supply a carrier gas to the raw material container; a supply line configured to supply the raw material gas with the carrier gas; a controller configured to control at least one of the heater and a flow rate of the carrier gas supplied from the carrier gas supplier; and a determination portion configured to determine an initial filling state of the raw material container attached to the attachment portion. The processing method includes determining the initial filling state of the raw material container based on an operation record and a table.

9 Claims, 8 Drawing Sheets

(56) References Cited

U.S. PATENT DOCUMENTS

| | | | |
|---|---|---|---|
| 2006/0266289 A1* | 11/2006 | Verghese | C23C 16/45563 |
| | | | 118/729 |
| 2010/0012026 A1* | 1/2010 | Hirata | G05D 16/024 |
| | | | 137/468 |
| 2014/0020764 A1* | 1/2014 | Woelk | C23C 16/4481 |
| | | | 137/1 |
| 2016/0273101 A1* | 9/2016 | Komori | C23C 16/45561 |
| 2019/0177849 A1 | 6/2019 | Mo et al. | |

FOREIGN PATENT DOCUMENTS

| | | |
|---|---|---|
| JP | 2003-160865 A | 6/2003 |
| JP | 2004-131845 A | 4/2004 |
| JP | 2015-193908 A | 11/2015 |

\* cited by examiner

FIG. 2

| | S1 Raising pressure and stabilizing substrate temperature | S2 CVD film formation | S3 Purging |
|---|---|---|---|
| WCl$_6$ (Carrier N$_2$) | | → | |
| H$_2$ | | → | |
| Purge N$_2$ (line 60) | →  | → | → |
| Purge N$_2$ (line 70) | → | → | → |

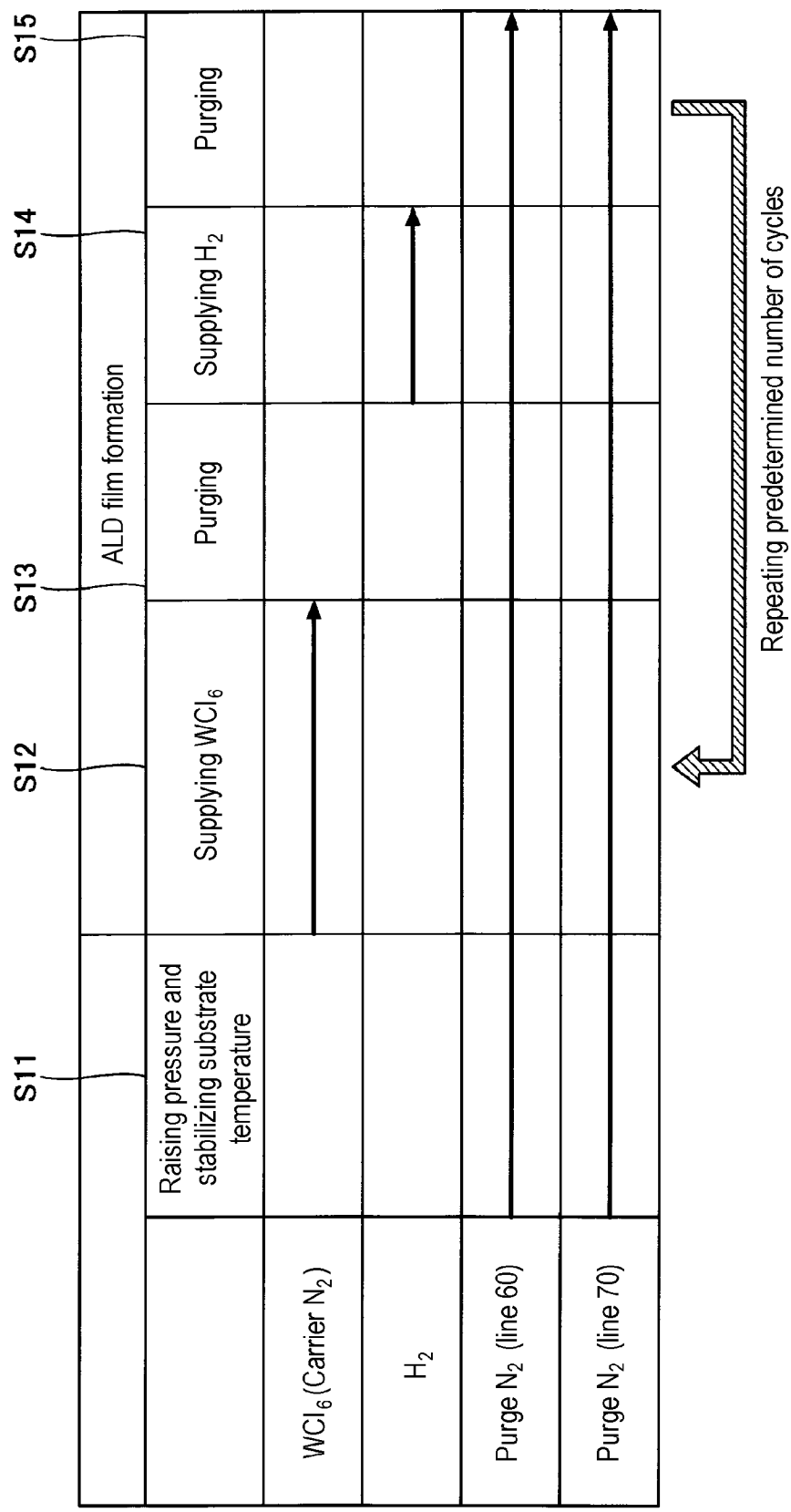

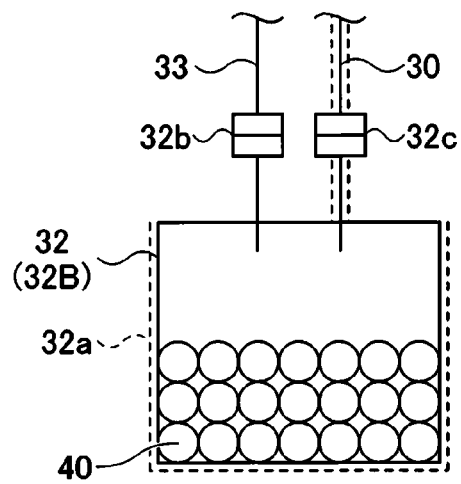
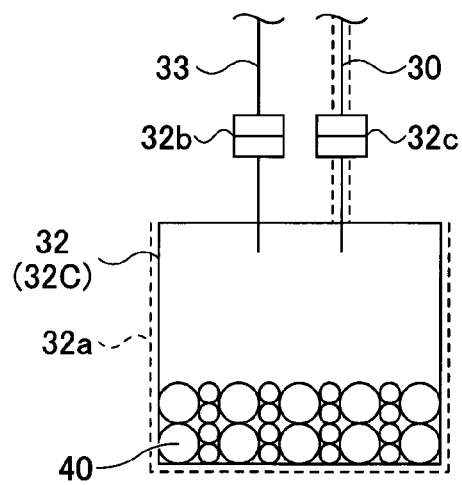

PROCESSING METHOD AND SUBSTRATE PROCESSING SYSTEM

CROSS-REFERENCE TO RELATED APPLICATIONS

This application is a National Stage Application of International Patent Application No. PCT/JP2020/020191, having an International Filing Date of May 21, 2020, which claims the benefit of priority to Japanese Patent Application No. 2019-114040, filed Jun. 19, 2019, each of which is hereby incorporated by reference herein.

TECHNICAL FIELD

The present disclosure relates to a processing method and a substrate processing system.

BACKGROUND

There is known a substrate processing apparatus which sublimates a solid raw material at room temperature, supplies the raw material gas with a carrier gas to the processing container, and performs a desired process on a substrate in a processing container.

Patent Document 1 discloses that tungsten chloride, which is a solid raw material, is sublimated to generate tungsten chloride gas. A method of forming a tungsten film is also disclosed and includes: supplying a tungsten chloride gas as a tungsten raw material and a reduction gas to a substrate simultaneously or alternately under a depressurized atmosphere; and causing the tungsten chloride gas and the reduction gas to be reacted with each other while heating the substrate, so that a tungsten film is formed on the surface of the substrate.

PRIOR ART DOCUMENTS

Patent Documents

Patent Document 1: Japanese Laid-Open Patent Publication No. 2015-193908

An aspect of the present disclosure provides a processing method and a substrate processing system which stably supply a raw material gas to a processing container.

SUMMARY

In order to solve the above problem, an aspect of the present disclosure provides a processing method of a substrate processing system including: a processing container including a stage on which a substrate is placed; an attachment portion to which a raw material container configured to accommodate a solid raw material is detachably attached; a heater configured to produce a raw material gas by vaporizing a solid raw material accommodated in the raw material container; a carrier gas supplier configured to supply a carrier gas to the raw material container; a supply line configured to supply the raw material gas with the carrier gas from the raw material container to the processing container; a controller configured to control at least one of the heater and a flow rate of the carrier gas supplied from the carrier gas supplier in order to control a flow rate of the raw material gas which is supplied to the processing container; and a determination portion configured to determine an initial filling state of the raw material container attached to the attachment portion, wherein the processing method comprises determining, by the determination portion, the initial filling state of the raw material container based on an operation record and a table.

According to an aspect of the present disclosure, it is possible to provide a processing method and a substrate processing system which stably supply a raw material gas to a processing container.

BRIEF DESCRIPTION OF DRAWINGS

FIG. 2 illustrates an example of a gas supply sequence when forming a film through a CVD process.

FIG. 3 illustrates an example of a gas supply sequence when forming a film by the ALD process.

FIG. 4C is a schematic view illustrating an example of a raw material container according to the present embodiment.

FIG. 4D is a schematic view illustrating an example of another raw material container according to the present embodiment.

DETAILED DESCRIPTION

Figure 1:
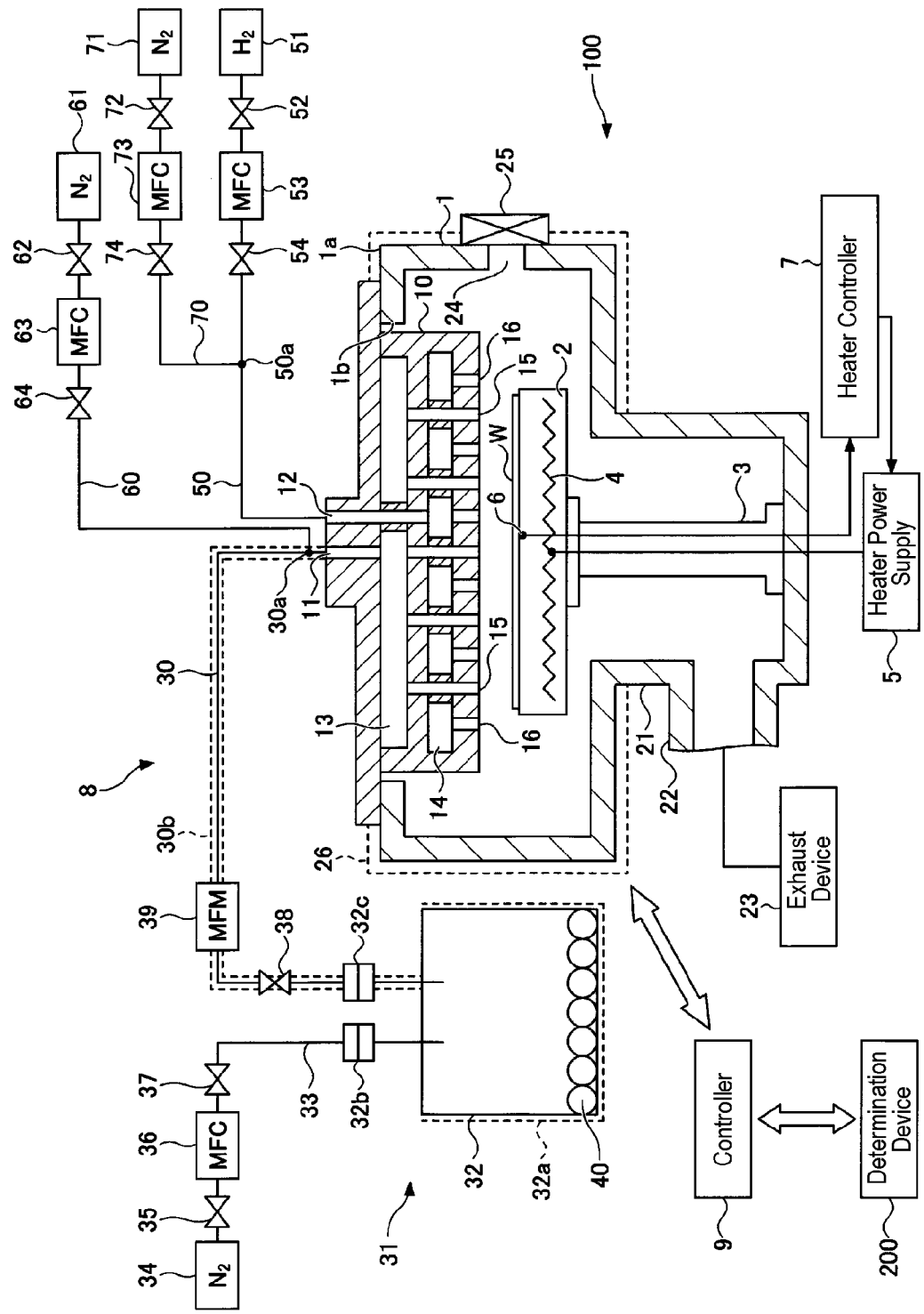
FIG. 1 is an example of a schematic cross-sectional view of a substrate processing system according to an embodiment.

Hereinafter, embodiments of the present disclosure will be described with reference to the accompanying drawings. In each of the drawings, the same components are denoted by the same reference numerals, and redundant descriptions thereof may be omitted.

<Substrate Processing System>

The substrate processing system according to the present embodiment will be described with reference to FIG. 1. FIG. 1 is an example of a schematic cross-sectional view of a substrate processing system according to the present embodiment. The substrate processing system includes a substrate processing apparatus 100, a plurality of attachable/detachable raw material containers 32, and a determination device 200 configured to determine an initial filling state of the raw material container 32.

The substrate processing apparatus 100 is an apparatus for forming a tungsten film on the surface of a substrate W, such as a wafer, by supplying a tungsten chloride ($WCl_6$) gas as a film-forming raw material gas and $H_2$ gas as a reduction gas to the substrate W. The substrate processing apparatus 100 includes, for example, a chemical vapor deposition (CVD) apparatus, an atomic layer deposition (ALD) apparatus, and the like.

The substrate processing apparatus 100 includes a substantially cylindrical chamber 1 that is hermetically configured, and a susceptor 2 configured to horizontally support a substrate W, which is a substrate, is disposed in the chamber 1 in a state of being supported by a cylindrical support member 3 reaching the lower center of the susceptor 2 from the bottom of an exhaust chamber 21 to be described later. The susceptor 2 is made of ceramic such as AlN. A heater 4 is embedded in the susceptor 2, and a heater power supply 5 is connected to the heater 4. Meanwhile, a thermocouple 6 is provided near the top surface of the susceptor 2, and a signal of the thermocouple 6 is transmitted to the heater controller 7. The heater controller 7 transmits a command to the heater power supply 5 in response to the signal of the thermocouple 6 to control the heating of the heater 4 to control the substrate W to a predetermined temperature. The susceptor 2 is provided with three substrate lifting pins (not illustrated) to be capable of protruding or sinking with respect to the surface of the susceptor 2, and the substrate lifting pins are in a state of protruding from the surface of the susceptor 2 when the substrate W is transported. The susceptor 2 is configured to be raised and lowered by a lifting mechanism (not illustrated).

A circular hole 1b is formed in the ceiling wall 1a of the chamber 1, and the shower head 10 is fitted to protrude into the chamber 1 from the circular hole 1b. The shower head 10 ejects various processing gases supplied from a processing gas supply mechanism 8 to be described later into the chamber 1. Above the shower head 10, a first introduction path 11 configured to introduce a film-forming raw material gas ($WCl_6$ gas) and a purge gas ($N_2$ gas) and a second introduction path 12 configured to introduce a reduction gas ($H_2$ gas) and a purge gas ($N_2$ gas) are provided.

Inside the shower head 10, spaces 13 and 14 are provided in two upper and lower stages. The first introduction path 11 is connected to the upper space 13. A first gas ejection path 15 extends from this space 13 to the bottom surface of the shower head 10. The second introduction path 12 is connected to the lower space 14. A second gas ejection path 16 extends from this space 14 to the bottom surface of the shower head 10. That is, the shower head 10 is configured such that the film-forming raw material gas ($WCl_6$ gas) and the reduction gas ($H_2$ gas) are independently ejected from the gas ejection paths 15 and 16, respectively.

The bottom wall of the chamber 1 is provided with an exhaust chamber 21, which protrudes downward. An exhaust pipe 22 is connected to the side surface of the exhaust chamber 21, and an exhaust device 23 including a vacuum pump, a pressure control valve, and the like is connected to the exhaust pipe 22. By operating the exhaust device 23, the interior of the chamber 1 can be brought into a predetermined depressurized (vacuum) state.

The sidewall of the chamber 1 is provided with a carry-in/out port 24 configured to perform carry-in/out of a substrate W and a gate valve 25 configured to open/close the carry-in/out port 24. Further, the wall of the chamber 1 is provided with a heater 26 so that the temperature of the inner wall of the chamber 1 can be controlled during a film forming process.

The processing gas supply mechanism 8 includes a film-forming raw material gas supply line 30, a reduction gas supply line 50, a first purge gas supply line 60, and a second purge gas supply line 70.

The film-forming raw material gas supply line 30 extends from a $WCl_6$ gas supply mechanism 31, which is a source of the film-forming raw material gas ($WCl_6$), and is connected to the first introduction path 11.

The $WCl_6$ gas supply mechanism 31 includes a raw material container 32 configured to accommodate a solid raw material 40 ($WCl_6$) which is a film-forming raw material. $WCl_6$ is a solid at room temperature, and $WCl_6$ which is tungsten chloride as a tungsten raw material is accommodated in the raw material container 32 as a solid. A heater 32a is provided around the raw material container 32, and the film-forming raw material in the raw material container 32 is heated to an appropriate temperature to sublimate $WCl_6$. The tungsten chloride is not limited to $WCl_6$, and, for example, $WCl_5$, $WCl_4$, or the like may be used.

A carrier gas supply line 33 configured to supply $N_2$ gas, which is a carrier gas, is connected to the raw material container 32. The carrier gas supply line 33 extends from the $N_2$ gas source 34, which is the source of the carrier gas ($N_2$), and is connected to the raw material container 32. The carrier gas supply line 33 is provided with a valve 35, a mass flow controller 36, a valve 37, and a coupler 32b, which will be described later, in this order from the $N_2$ gas source 34. The mass flow controller 36 controls the flow rate of the $N_2$ gas flowing through the carrier gas supply line 33. The valves 35 and 37 switch between supplying and stopping of the $N_2$ gas. The carrier gas is not limited to the $N_2$ gas, and may be another inert gas such as Ar gas.

The film-forming raw material gas supply line 30 configured to supply the film-forming raw material gas is connected to the raw material container 32. The film-forming raw material gas supply line 30 is provided with a coupler 32c, a valve 38, a mass flow meter 39, and a merging portion 30a, which will be described later, in this order from the raw material container 32. The valve 38 switches between supplying and stopping of the $WCl_6$ gas. The film-forming raw material gas supply line 30 is provided with a heater 30b configured to prevent condensation of the $WCl_6$ gas. The $WCl_6$ gas sublimated in the raw material container 32 is carried by the $N_2$ gas as a carrier gas (carrier $N_2$) and is supplied into the shower head 10 via the film-forming raw material gas supply line 30 and the first introduction path 11.

The raw material container 32 configured to accommodate the solid raw material 40 is configured to be detachably attached to the carrier gas supply line 33 and the film-forming raw material gas supply line 30 via the couplers 32b and 32c.

The reduction gas supply line 50 extends from a $H_2$ gas source 51, which is the source of the reduction gas ($H_2$) and is connected to the second introduction path 12. The reduction gas supply line 50 is provided with a valve 52, a mass flow controller 53, a valve 54, and a merging portion 50a, which will be described later, in this order from the $H_2$ gas source 51. The mass flow controller 53 controls the flow rate of the $H_2$ gas flowing through the reduction gas supply line 50. The valves 52 and 54 switch between supplying and stopping of the $H_2$ gas. The reduction gas is not limited to $H_2$ gas, and $SiH_4$ gas, $B_2H_6$ gas, and $NH_3$ gas may also be used. Two or more of the $H_2$ gas, the $SiH_4$ gas, the $B_2H_6$ gas, and the $NH_3$ gas may be supplied. Furthermore, other reduction gases other than these gases, for example, $PH_3$ gas and $SiH_2Cl_2$ gas, may be used.

The first purge gas supply line 60 extends from a $N_2$ gas source 61, which is the source of the purge gas ($N_2$), and is connected to the merging portion 30a of the film-forming raw material gas supply line 30. The first purge gas supply line 60 is provided with a valve 62, a mass flow controller 63, and a valve 64 in this order from the $N_2$ gas source 61. The mass flow controller 63 controls the flow rate of the $N_2$ gas flowing through the first purge gas supply line 60. The valves 62 and 64 switch between supplying and stopping of $N_2$ gas during an ALD process. The purge gas is not limited to the $N_2$ gas, and may be another inert gas such as Ar gas.

The second purge gas supply line 70 extends from a $N_2$ gas source 71, which is the source of the purge gas ($N_2$), and is connected to the merging portion 50a of the reduction gas supply line 50. The second purge gas supply line 70 is provided with a valve 72, a mass flow controller 73, and a valve 74 in this order from the $N_2$ gas source 71. The mass flow controller 73 controls the flow rate of the $N_2$ gas flowing through the second purge gas supply line 70. The valves 72 and 74 switch between supplying and stopping of $N_2$ gas during an ALD process. The purge gas is not limited to the $N_2$ gas, and may be another inert gas such as Ar gas.

The controller 9 controls the operation of each part of the substrate processing apparatus 100. The controller 9 includes a central processing unit (CPU), a read only memory (ROM), and a random access memory (RAM). The CPU executes a desired process according to a recipe stored in a storage area of, for example, the RAM. In the recipe, apparatus control information for process conditions is set. The control information may include, for example, gas flow rate, pressure, temperature, and process time. A program used by the recipe and the controller 9 may be stored in, for example, a hard disk or a semiconductor memory. In addition, for example, the recipe may be set at a predetermined position to be read in the state of being stored in a storage medium readable by a portable computer, such as a CD-ROM or a DVD.

Next, the operation of forming a tungsten film using the substrate processing apparatus 100 according to the present embodiment will be described with reference to FIGS. 2 and 3.

<Film Formation Through CVD Process>

FIG. 2 illustrates an example of a gas supply sequence when forming a tungsten film through a CVD process.

First, a substrate W is carried into the substrate processing apparatus 100. Specifically, the controller 9 opens the gate valve 25. Subsequently, the substrate W is carried into the chamber 1 through the carry-in/out port 24 by a transport arm (not illustrated), and the substrate W is placed on the susceptor 2. The susceptor 2 is heated to a predetermined temperature (e.g., 350 degrees C. to 550 degrees C.) by the heater 4. When the transport arm retracts from the carry-in/out port 24, the gate valve 25 is closed. As the substrate W, for example, a substrate W in which a barrier metal film (e.g., TiN film or TiSiN film) is formed as a base film on the surface of a thermal oxide film or the surface of an interlayer insulating film having a recess, such as a trench or hole, may be used. Since the tungsten film has poor adhesion to the thermal oxide film and the interlayer insulating film and causes an incubation time to be long, it is difficult to form a film on the thermal oxide film or the interlayer insulating film, but by using a TiN film or a TiSiN film as a base film, film formation becomes easy. However, the base film is not limited thereto. In the following description, assuming that valves 35, 37, 52, 62, and 72 are open, the opening/closing control of the valves 38, 54, 64, 74 will be described.

In step S1, the pressure in the chamber 1 is increased, and the temperature of the substrate W is stabilized. Specifically, the controller 9 closes the valve 38, closes the valve 54, opens the valve 64, and opens the valve 74. As a result, the purge $N_2$ gas of the $N_2$ gas sources 61 and 71 is supplied into the chamber 1 to increase the pressure in the chamber 1, and the temperature of the substrate W on the susceptor 2 is stabilized.

After the pressure in the chamber 1 reaches a predetermined pressure, CVD film formation is performed in step S2. Specifically, the controller 9 opens the valve 38 and opens the valve 54 while flowing the purge $N_2$ gas. Here, the carrier $N_2$ gas of the $N_2$ gas source 34 is supplied to the raw material container 32. The solid $WCl_6$ in the raw material container 32 is heated by the heater 32a and is sublimated to generate $WCl_6$ gas. As a result, the $WCl_6$ gas is supplied from the $WCl_6$ gas supply mechanism 31 with the carrier $N_2$ gas into the chamber 1. In addition, the $H_2$ gas of the $H_2$ gas source 51 is supplied into the chamber 1. As a result, the $WCl_6$ gas, which is a film-forming raw material gas, reacts with the $H_2$ gas, which is a reduction gas, on the surface of the substrate W heated by the heater 4, and a tungsten film is formed. The thickness of the tungsten film is controlled by a film formation time. As a result, a tungsten film having a desired thickness is formed.

The controller 9 obtains the flow rate of the film-forming raw material gas based on the flow rate of the carrier gas by the mass flow controller 36 and the flow rate of the film-forming raw material gas and the carrier gas by the mass flow meter 39. In addition, the controller 9 controls the flow rate of the carrier gas by the mass flow controller 36 and the temperature of the solid raw material 40 by the heater 32a to control the flow rate of the film-forming raw material gas supplied to the chamber 1.

In step S3, the interior of the chamber 1 is purged. Specifically, the controller 9 closes the valve 38 and closes the valve 54 while flowing the purge $N_2$ gas. As a result, the supply of the $WCl_6$ gas and the $H_2$ gas into the chamber 1 is stopped. In addition, the purge $N_2$ gas is supplied into the chamber 1 to purge the $WCl_6$ gas, the $H_2$ gas, and a reaction product in the chamber 1.

Thereafter, the substrate W is carried out of the substrate processing apparatus 100. Specifically, the controller 9 opens the gate valve 25. Subsequently, the substrate W subjected to film formation is carried out from the chamber 1 through the carry-in/out port 24 by the transport arm (not illustrated). When the transport arm retracts from the carry-in/out port 24, the gate valve 25 is closed.

As described above, the substrate processing apparatus 100 according to the present embodiment forms a tungsten film through a CVD process.

<Film Formation through ALD Process>

FIG. 3 illustrates an example of a gas supply sequence when forming a tungsten film through an ALD process.

First, a substrate W is carried into the substrate processing apparatus 100. Specifically, the controller 9 opens the gate valve 25. Subsequently, the substrate W is carried into the chamber 1 through the carry-in/out port 24 by a transport arm (not illustrated), and the substrate W is placed on the susceptor 2. The susceptor 2 is heated to a predetermined temperature (e.g., 350 degrees C. to 550 degrees C.) by the heater 4. When the transport arm retracts from the carry-in/out port 24, the gate valve 25 is closed. As the substrate W, for example, a substrate W in which a barrier metal film (e.g., TiN film or TiSiN film) is formed as a base film on the surface of a thermal oxide film or the surface of an interlayer insulating film having a recess, such as a trench or hole, is used. Since the tungsten film has poor adhesion to the thermal oxide film and the interlayer insulating film and also causes an incubation time to be long, it is difficult to form a film on the thermal oxide film or the interlayer insulating film, but by using a TiN film or a TiSiN film as a base film, film formation becomes easy. However, the base film is not limited thereto. In the following description, assuming that valves 35, 37, 52, 62, and 72 are open, the opening/closing control of the valves 38, 54, 64, and 74 will be described.

In step S11, the pressure in the chamber 1 is increased, and the temperature of the substrate W is stabilized. Specifically, the controller 9 closes the valve 38, closes the valve 54, opens the valve 64, and opens the valve 74. As a result, the purge $N_2$ gas of the $N_2$ gas sources 61 and 71 is supplied into the chamber 1 to increase the pressure in the chamber 1, and the temperature of the substrate W on the susceptor 2 is stabilized.

Hereinafter, ALD film formation is performed by repeating steps S12 to S15 for a predetermined number of cycles.

In step S12, $WCl_6$ gas, which is a film-forming raw material gas, is supplied into the chamber 1. Specifically, the controller 9 opens the valve 38 and supplies the $WCl_6$ gas with a carrier $N_2$ gas from the $WCl_6$ gas supply mechanism 31 into the chamber 1 while supplying purge $N_2$ gas from the first purge gas supply line 60 in the state in which the valve 64 is open and while supplying purge $N_2$ gas from the second purge gas supply line 70 in the state in which the valve 74 is open. The $WCl_6$ gas supplied into the chamber 1 is adsorbed on the surface of the substrate W.

The controller 9 obtains the flow rate of the film-forming raw material gas based on the flow rate of the carrier gas by the mass flow controller 36 and the flow rate of the film-forming raw material gas and the carrier gas by the mass flow meter 39. In addition, the controller 9 controls the flow rate of the carrier gas by the mass flow controller 36 and the temperature of the solid raw material 40 by the heater 32a to control the flow rate of the film-forming raw material gas supplied to the chamber 1 to be constant.

In step S13, the excess $WCl_6$ gas in the chamber 1 is purged. Specifically, the controller 9 closes the valve 38. As a result, the supply of the $WCl_6$ gas into the chamber 1 is stopped. In addition, the purge $N_2$ gas is supplied into the chamber 1 from the first purge gas supply line 60 and the second purge gas supply line 70 to purge the excess $WCl_6$ gas in the chamber 1.

In step S14, $H_2$ gas, which is a reduction gas, is supplied into the chamber 1. Specifically, the controller 9 opens the valve 54 and supplies the $H_2$ gas from the $H_2$ gas source 51 into the chamber 1 while supplying purge $N_2$ gas from the first purge gas supply line 60 in the state in which the valve 64 is open and while supplying purge $N_2$ gas from the second purge gas supply line 70 in the state in which the valve 74 is open. The $H_2$ gas supplied into the chamber 1 reacts with (reduces) the $WCl_6$ adsorbed on the surface of the substrate W to form a tungsten film. The thickness of the tungsten film is controlled by a film formation time.

In step S15, the excess $H_2$ gas and a reaction product in the chamber 1 are purged. Specifically, the controller 9 closes the valve 54. As a result, the supply of $H_2$ gas into the chamber 1 is stopped. In addition, purge $N_2$ gas is supplied into the chamber 1 from the first purge gas supply line 60 and the second purge gas supply line 70 to purge the excess $H_2$ gas and the reaction product in the chamber 1.

Hereinafter, steps S12 to S15 are repeated for a predetermined number of cycles to form a tungsten film having a desired thickness.

Thereafter, the substrate W is carried out of the substrate processing apparatus 100. Specifically, the controller 9 opens the gate valve 25. Subsequently, the substrate W in which the film-formation has been completed is carried out from the chamber 1 via the carry-in/out port 24 by the transport arm (not illustrated). When the transport arm retracts from the carry-in/out port 24, the gate valve 25 is closed.

As described above, the substrate processing apparatus 100 according to the present embodiment forms a tungsten film through an ALD process.

<Raw Material Container>

Figure 5:
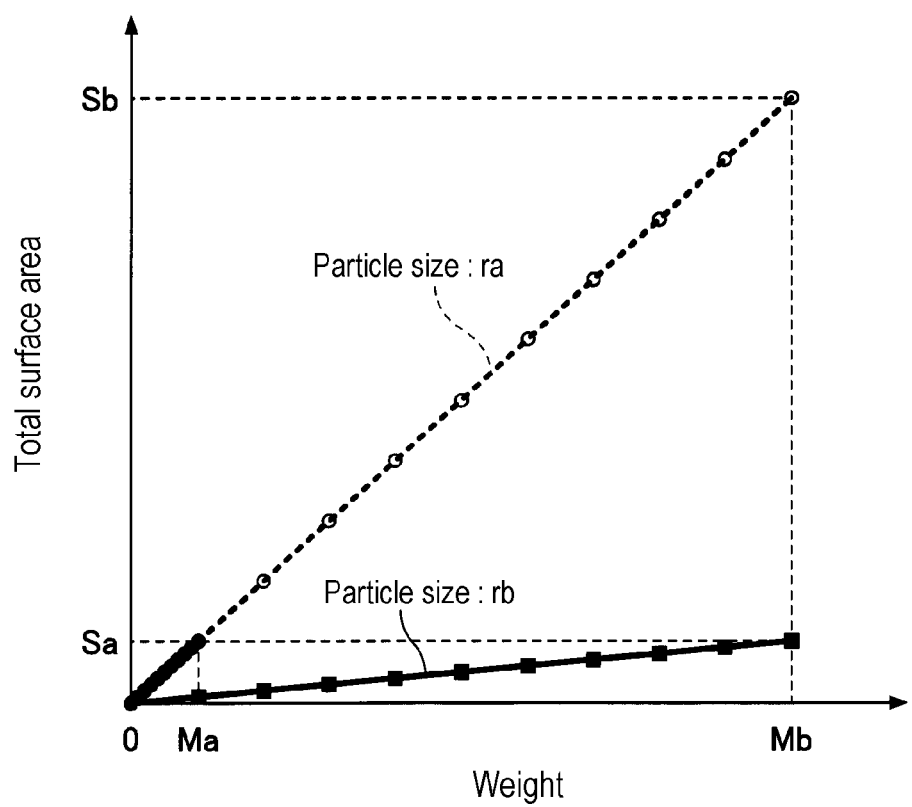
FIG. 5 is an example of a graph illustrating the relationship between the weight of a solid raw material and the total surface area of the solid raw material.
Figure 6:
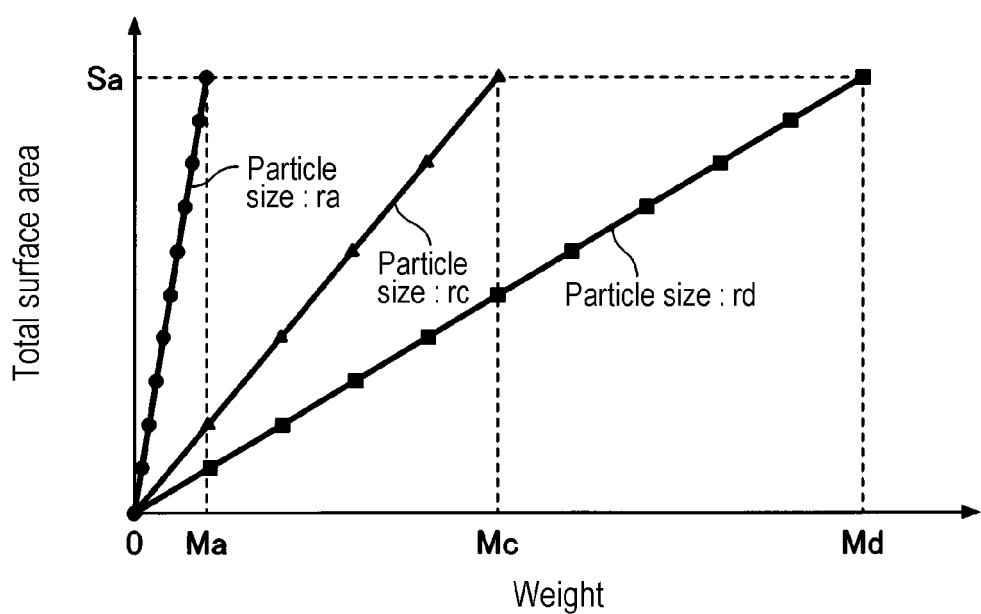
FIG. 6 is an example of a graph illustrating the relationship between the weight of a solid raw material and the total surface area of the solid raw material.
Figure 7:
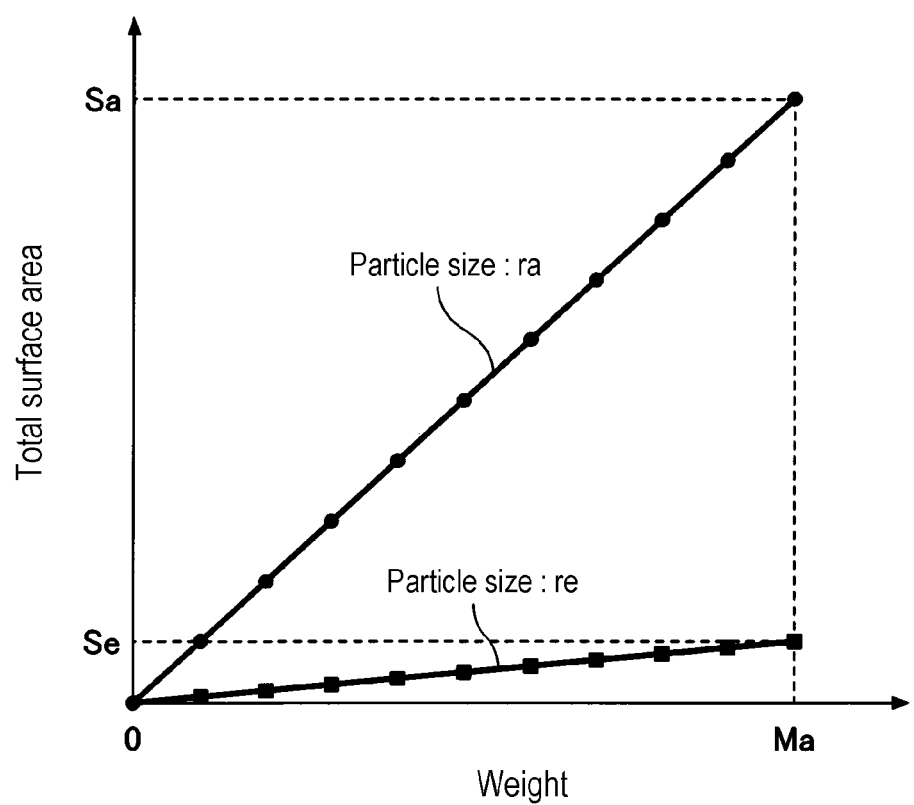
FIG. 7 is an example of a graph illustrating the relationship between the weight of a solid raw material and the total surface area of the solid raw material.

Next, the raw material container 32 configured to accommodate a solid raw material 40 will be further described with reference to FIGS. 4A to 4D and FIGS. 5 to 7. FIGS. 4A to 4D are schematic views illustrating examples of the raw material container 32. FIGS. 5 to 7 are examples of graphs illustrating the relationship between the weight of the solid raw material 40 and the total surface area of the solid raw material 40.

When the solid raw material 40 accommodated in the raw material container 32 is used until the remaining amount of the solid raw material 40 is equal to or less than a predetermined amount, the vaporization amount of a raw material gas decreases. Thus, the raw material container 32 is replaced. It is required to improve the usage rate of the solid raw material 40 accommodated in the raw material container 32 (the usage rate=1−remaining amount at the time of replacement/initial filling amount). Therefore, it is required to improve the usage rate of the solid raw material 40 by increasing the initial filling amount (volume, weight) of the solid raw material 40 accommodated in the raw material container 32. In order to reduce the frequency of replacement of the raw material container 32, it is required to increase the initial filling amount (volume, weight) of the solid raw material 40 accommodated in the raw material container 32.

Figure 4A:
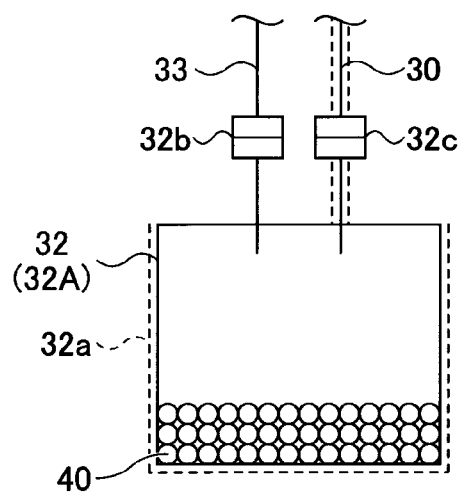
FIG. 4A is a schematic view illustrating an example of a raw material container.

A solid raw material 40 having an initial particle size ra and an initial weight (an initial filling amount) Ma is accommodated in the raw material container 32A illustrated in FIG. 4A. The relationship between the weight and the total surface area in this configuration is illustrated by the black circles in FIG. 5. The total surface area of the solid raw material 40 at the initial stage is Sa. When the solid raw material 40 is vaporized and the raw material gas is released, the weight is reduced and the particle size is also reduced. Thus, the total surface area is also reduced.

Figure 4B:
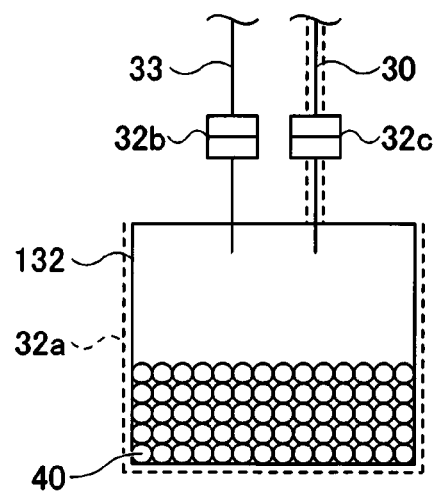
FIG. 4B is a schematic view illustrating an example of a raw material container according to a reference example.

FIG. 4B illustrates a raw material container 132 according to a reference example. In the raw material container 132 according to the reference example, the initial weight of the solid raw material 40 is simply increased (e.g., 10 times). That is, the raw material container 132 includes the solid raw material 40 having an initial particle size ra and an initial weight Mb (Mb>>Ma). The relationship between the weight and the total surface area in this configuration is illustrated by the white circles and broken lines in FIG. 5. The total surface area of the solid raw material 40 at the initial stage is Sb (Sb>>Sa). For example, when the initial filling amount is increased 10 times, the initial total surface area is also increased 10 times.

Since the solid raw material 40 vaporizes from the surface thereof, the vaporization rate of the raw material gas depends on the total surface area of the solid raw material 40. Therefore, when the raw material gas is supplied to the chamber 1 using the raw material container 132 illustrated in FIG. 4B, the amount of change in the total surface area of the solid raw material 40 from the initial stage (the state in which a new raw material container is attached) to the time of replacement (the state in which the raw material container is replaced) is greater than the amount of change in the total surface area of the solid raw material 40 from the initial time to the time of replacement in the raw material container 32A illustrated in FIG. 4A. Therefore, adjustment parameters (the flow rate of a carrier gas by the mass flow controller 36 and the temperature of a raw material by the heater 32a) in the case in which the raw material gas is supplied to the chamber 1 using the raw material container 132 illustrated in FIG. 4B are required to be changed more greatly than those in the case in which the raw material gas is supplied to the chamber 1 using the raw material container 32A illustrated in FIG. 4A. For these reason, there is a concern that the adjustment parameters of the mass flow controller 36 and the heater 32a deviate from a predetermined range.

FIG. 4C illustrates another raw material container 32B according to the present embodiment. The other raw material container 32B according to the present embodiment increases the initial weight and adjusts the particle size of the solid raw material 40. The other raw material container 32B according to the present embodiment accommodates a solid raw material 40 having an initial particle size rb and an initial weight Mb (Mb>>Ma). The relationship between the weight and the total surface area in this configuration is illustrated by the black square marks and the solid line in FIG. 5. Here, the initial particle size rb is adjusted such that the initial total surface area is equal to the initial total surface area Sa in the raw material container 32A (or falls within a predetermined allowable range). Here, the initial particle size rb is set to be greater than the initial particle size ra. This makes it possible to maintain the initial total surface area at Sa while increasing the initial filling amount of the solid raw material 40 in the raw material container 32B.

As a result, even when the raw material container 32B is used, it is possible to adjust the supply amount of the raw material gas within the ranges of the adjustment parameters (the flow rate of the carrier gas by the mass flow controller 36 and the temperature of the raw material by the heater 32a) in the raw material container 32A.

In addition, as illustrated in FIG. 6, by controlling the initial particle size of the solid raw material 40 filled in the raw material container 32, it is possible to increase the initial weight while maintaining the initial total surface area Sa. For example, by setting the initial particle size to rc (rc>ra), it is possible to set the initial weight to Mc (Mc>Ma) while maintaining the initial total surface area at Sa. For example, by setting the initial particle size to rd (rd>rc>ra), it is possible to set the initial weight to Md (Md>Mc>Ma) while maintaining the initial total surface area at Sa. That is, by controlling the initial particle size, it is possible to impart the same initial total surface area for an arbitrary filling amount.

In addition, as illustrated in FIG. 7, by controlling the initial particle size re of the solid raw material 40 filled in the raw material container 32, it is possible to reduce the adjustment amount of a control parameter while maintaining the initial weight Ma. The initial total surface area Se (Se<Sa) is set to satisfy the necessary and sufficient supply amount of the raw material gas from the initiation of use of the raw material container 32 to the termination of use of the raw material container 32.

That is, when the solid raw material 40 is vaporized and the raw material gas is released, the weight is reduced and the particle size is also reduced. Thus, the total surface area is also reduced. Therefore, the vaporized amount of the solid raw material 40 is also reduced. In this case, the controller 9 maintains the supply amount of the raw material gas supplied to the chamber 1 by adjusting a control parameter. Here, as the control parameter, for example, the flow rate of the carrier gas by the mass flow controller 36 is used. When the vaporized amount of the solid raw material 40 is reduced, the supply amount of the raw material gas supplied to the chamber 1 is maintained by increasing the flow rate of the carrier gas. In addition, as the control parameter, for example, the heating temperature of the solid raw material 40 by the heater 32a is used. When the vaporized amount of the solid raw material 40 is reduced, the heating temperature of the solid raw material 40 is raised to maintain the supply amount of the raw material gas supplied to the chamber 1. As control parameters, both the flow rate of the carrier gas and the heating temperature may be controlled.

Here, the greater the amount of change in the total surface area of the solid raw material 40 from the initiation of use of the raw material container 32 to the termination of use of the raw material container 32, the greater the adjustment amount of the control parameter (flow rate of the carrier gas, heating temperature). When the adjustment amount of the control parameter is increased, the adjustment amount may deviate from an appropriate adjustable range in the CVD process or the ALD process, and it may be difficult to sufficiently use up the solid raw material 40 in the raw material container 32.

In contrast, as illustrated in FIG. 7, by adjusting the initial particle size of the solid raw material 40, it is possible to reduce the amount of change in the total surface area of the solid raw material 40 from the initiation of use of the raw material container 32 to the termination of use of the raw material container 32. This makes it possible to reduce the adjustment amount of the control parameter, so that it is possible to prevent the adjustment amount of the control parameter from being deviated from the appropriate adjustable range in the CVD process or the ALD process. Therefore, it becomes easy to sufficiently use up the solid raw material 40 in the raw material container 32.

Returning back to FIG. 1, the determination device 200 is a device for determining the initial filling state (the initial weight and the initial particle size of the solid raw material 40) of the raw material container 32 attached to the substrate processing apparatus 100. An operator who replaces the raw material container 32 attaches the raw material container 32 filled with the solid raw material 40 having the initial weight and the initial particle size determined by the determination device 200 to the substrate processing apparatus 100.

The determination device 200 is connected to the controller 9 of the substrate processing apparatus 100 to be communicable with the controller 9, and the operation record (history) of the substrate processing apparatus 100 is input to the determination device 200. The operation record also includes information on the initial filling state of the raw material container 32 attached to the substrate processing apparatus 100. The input operation record of the substrate processing apparatus 100 is stored in a storage part (not illustrated) of the determination device 200. In addition, in the storage part of the determination device 200, for example, a table corresponding to graphs illustrated in FIGS. 5 to 7 is stored. In the table the particle size, weight, and total surface area of the solid raw material 40 are associated with each other.

The determination device 200 determines the weight and particle size of the solid raw material 40 to be filled in the raw material container 32 to be attached next time, based on the operation record of the substrate processing apparatus 100 and the table.

For example, the determination device 200 determines the initial total area of the next solid raw material 40 based on the operation record. For example, the determination device 200 reads the initial total area of the past (previous) solid raw material 40 from the operation record of the storage part and determines the initial total area of the next solid raw material 40. In addition, for example, the determination device 200 reads the maximum value and the minimum value of the initial total area of the solid raw material 40 having an operation record and determines the initial total area of the next solid raw material 40 from the range of the maximum value and the minimum value. As a result, the adjustment amount of the control parameter may be set to be within the range in which the operation record is available. When information on the initial filling state of the raw material container 32 included in the operation record stored in the storage part (not illustrated) is the initial weight and the initial particle size of the solid raw material 40, the initial total surface area is calculated based on the table.

In addition, the determination device 200 determines the initial weight (the initial filling amount) of the next solid raw material 40. For example, the remaining number of substrates W to be processed by the substrate processing apparatus 100 is acquired based on the operation record. For example, when the remaining number of substrates W to be processed in the substrate processing apparatus 100 is sufficiently large, the initial weight of the next solid raw material 40 may be increased compared to the initial weight of the past (previous) solid raw material 40. This makes it possible to reduce the frequency of replacement of the raw material container 32. In addition, by increasing the initial filling amount, it is possible to improve the usage rate of the solid raw material 40 (the usage rate=1–remaining amount at the time of replacement/initial filling amount). Furthermore, for example, the initial weight of the next solid raw material 40 may be reduced compared to the initial weight of the past (previous) solid raw material 40 depending on the remaining number of the substrates W to be processed in the substrate processing apparatus 100. As a result, when all the substrates W are processed, the remaining amount of the solid raw material 40 in the raw material container 32 may be reduced. Therefore, the usage rate of the solid raw material 40 can be improved.

The determination device 200 determines the initial particle size of the solid raw material 40 based on the determined initial total area, initial weight, and table. By using the table in which the particle size, weight, and total surface area of the solid raw material 40 are associated with each other, it is possible to determine the initial particle size that satisfies the determined initial total area and initial weight.

The determination device 200 has been described with reference to the case in which the initial total area and the initial weight are determined based on an operation record and the initial particle size is determined based on the table by way of an example, but the present disclosure is not limited thereto. The determination device 200 may determine any two of the initial particle size, the initial weight, and the initial total area based on the operation record, and may determine the other one based on the table.

In the foregoing, a film forming method according to the present embodiment using a substrate processing system according to the present embodiment has been described. However, the present disclosure is not limited to the above-described embodiment or the like, and can be variously modified and improved within the scope of the present disclosure described in the claims.

Although the controller 9 and the determination device 200 of the substrate processing apparatus 100 have been described as being provided separately, the controller 9 may also function as the determination device 200.

In addition, an example for determining the initial particle size of the solid raw material 40 based on the initial total area, the initial weight, and the table has been described using the determination device 200, but the present disclosure is not limited thereto. For example, the function of the determination device 200 may be imparted to a host that is at a higher level than the apparatus (the substrate processing apparatus 100). In this case, the host may manage and determine the initial particle size of the solid raw material 40 to be filled in each raw material container 32 for a plurality of apparatuses (the substrate processing apparatus 100).

For example, solid raw materials 40 having different particle diameters may be mixed with each other as illustrated in FIG. 4D. In addition, controlling the particle size may include a case in which the mixing ratio of solid raw materials 40 having different particle sizes is changed.

Although the solid raw material 40 has been described as being a raw material gas for forming a tungsten film, the raw material gas is not limited thereto, and the film to be formed is not limited thereto. Furthermore, the process performed on a substrate W is not limited to the film formation. That is, the process may be widely applied to a substrate processing apparatus 100 that vaporizes a solid raw material and supplies the vaporized raw material to the chamber 1.

Although the single-wafer type substrate processing apparatus 100 has been described as an example, the present disclosure is not limited thereto. The present disclosure may be applied to the film formation of a tungsten film in a multi-wafer type processing apparatus. Furthermore, the present disclosure may be applied to the film formation of a tungsten film in a batch type substrate processing apparatus.

This application claims priority based on Japanese Patent Application No. 2019-114040 filed on Jun. 19, 2019, the disclosure of which is incorporated herein in its entirety by reference.

EXPLANATION OF REFERENCE NUMERALS

W: substrate, 100: substrate processing apparatus, 1: chamber (processing container), 2: susceptor, 3: support member, 4: heater (heating part), 8: processing gas supply mechanism, 9: controller, 30: film-forming raw material gas supply line (raw material gas supplier), 31: $WCl_6$ gas supply mechanism, 32: raw material container, 30b, 32a: heater, 32b, 32c: coupler (attachment portion), 33: carrier gas supply line, 34: $N_2$ gas source, 36: mass flow controller, 39: mass flow meter, 50: reduction gas supply line, 60: first purge gas supply line, 70: second purge gas supply line, 35, 37, 38, 52, 54, 62, 64, 72, 74: valve, 53, 63, 73: mass flow controller, 200: determination device (determination portion)

What is claimed is:

1. A processing method performed by a substrate processing system, the substrate processing system including:
    a processing container including a stage on which a substrate is placed;
    a coupler to which a raw material container configured to accommodate a solid raw material is detachably attached;
    a heater configured to produce a raw material gas by vaporizing the solid raw material accommodated in the raw material container;
    a carrier gas supplier configured to supply a carrier gas to the raw material container;
    a supply line configured to supply the raw material gas with the carrier gas from the raw material container to the processing container;
    a mass flow controller configured to control a flow rate of the carrier gas supplied from the carrier gas supplier;
    a mass flow meter configured to measure a flow rate of the mixture of the raw material gas and the carrier gas;
    a memory configured to store:
        a table including information on a particle size, a weight, and a total surface area of the solid raw material which are associated with one another; and
        an operation record including information on at least one initial total surface area of at least one past solid raw material, at least one initial weight of the at least one past solid raw material, at least one initial particle size of the at least one past solid raw material, and a remaining number of substrates to be processed by the substrate processing system; and a controller configured to:
control at least one of the heater or the mass flow controller in order to control a flow rate of the raw material gas which is supplied to the processing container;

the processing method comprising:
determining, by the controller, an initial total surface area of a next solid raw material based on the at least one initial total surface area of the at least one past solid raw material based on the operation record, such that an adjustment amount of control parameters to control the heater and the mass flow controller, which is required to maintain a flow rate of a next raw material gas to the processing chamber to be constant, falls within a predetermined range, wherein the control parameters include the flow rate of the carrier gas through the supply line and a heating temperature of the next solid raw material;

determining, by the controller, an initial weight of the next solid raw material based on the remaining number of substrates to be processed by the substrate processing system;

determining, by the controller, an initial particle size of the next solid raw material based on the determined initial total surface area, the determined initial weight and the table, upon attachment of a next raw material container filled with the next solid raw material having the determined initial total surface area, the determined initial weight, and the determined initial particle size, determining, by the controller, the control parameters based on the determined initial total surface area of the next solid raw material;

supplying, by the heater and the mass flow controller controlled by the controller, the next raw material gas from the next raw material container to the processing container based on the determined control parameters;

obtaining, by the controller, the flow rate of the next raw material gas based on the flow rate of the carrier gas by the mass flow controller and a flow rate of the mixture of the next raw material gas and the carrier gas by the mass flow meter;

controlling, by the controller, the heater and the mass flow controller to adjust the control parameters to maintain the flow rate of the next raw material gas to the processing chamber to be constant; and supplying, by the heater and the mass flow controller controlled by the controller, the next raw material gas based on the adjusted control parameters.

2. The processing method of claim 1, wherein an initial total surface area of the past solid raw material and an initial total surface area of the next solid raw material are equal to each other, and
the initial weight of the next solid raw material is greater than an initial weight of the past solid raw material.

3. The processing method of claim 2, further comprising:
determining the initial particle size of the next solid raw material such that the initial total surface area of the next solid raw material is maintained at a constant value of the initial total surface area of the past solid raw material and the initial weight of the next solid raw material becomes greater than the initial weight of the past solid raw material.

4. The processing method of claim 1, wherein an initial weight of the past solid raw material and the initial weight of the next solid raw material are equal to each other, and an amount of a change in a total surface area from initiation of use of the next raw material container to termination of use of the next raw material container is smaller than an amount of a change in a total surface area from initiation of use of the raw material container to termination of use of the raw material container.

5. The processing method of claim 4, further comprising:
determining the initial particle size of the next solid raw material such that the initial weight of the next solid raw material is maintained at the initial weight of the past solid raw material and an initial total surface area of the next solid raw material becomes smaller than an initial total surface area of the past solid raw material.

6. The processing method of claim 1, further comprising:
implementing a process on the substrate in a state in which the next raw material container is attached to the coupler.

7. A substrate processing system comprising:
a processing container including a stage on which a substrate is placed;
a coupler to which a raw material container configured to accommodate a solid raw material is detachably attached;
a heater configured to produce a raw material gas by vaporizing the solid raw material accommodated in the raw material container;
a carrier gas supplier configured to supply a carrier gas to the raw material container;
a supply line configured to supply the raw material gas with the carrier gas from the raw material container to the processing container;
a mass flow controller configured to control a flow rate of the carrier gas supplied from the carrier gas supplier;
a mass flow meter configured to measure a flow rate of the mixture of the raw material gas and the carrier gas;
a memory configured to store:
a table including information on a particle size, a weight, and a total surface area of the solid raw material which are associated with one another; and
an operation record including information on at least one initial total surface area of at least one past solid raw material, at least one initial weight of the at least one past solid raw material, at least one initial particle size of the at least one past solid raw material, and a remaining number of substrates to be processed by the substrate processing system; and a controller configured to:
control at least one of the heater or the mass flow controller in order to control a flow rate of the raw material gas which is supplied to the processing container;
determine an initial total surface area of a next solid raw material based on the at least one initial total surface area of the at least one past solid raw material based on the operation record, such that an adjustment amount of control parameters to control the heater and the mass flow controller, which is required to maintain a flow rate of a next raw material gas to the processing chamber to be constant, falls within a predetermined range, wherein the control parameters include the flow rate of the carrier gas through the supply line and a heating temperature of the next solid raw material;

determine an initial weight of the next solid raw material based on the remaining number of substrates to be processed by the substrate processing system;

determine an initial particle size of the next solid raw material based on the determined initial total surface area, the determined initial weight, and the table, upon attachment of a next raw material container filled with the next solid raw material having the determined initial total surface area, the determined initial weight, and the determined initial particle size, determine the control parameters based on the determined initial total surface area of the next solid raw material;

supply the next raw material gas from the next raw material container to the processing container based on the determined control parameters;

obtain the flow rate of the next raw material gas based on the flow rate of the carrier gas by the mass flow controller and a flow rate of the mixture of the next raw material gas and the carrier gas by the mass flow meter;

adjust the control parameters to maintain the flow rate of the next raw material gas to the processing chamber to be constant; and supply the next raw material gas based on the adjusted control parameters.

8. The substrate processing system of claim 7, wherein the controller is further configured to control at least one of the mass flow controller or the heater such that a supply amount of the raw material gas is constant.

9. The substrate processing system of claim 7,
wherein an initial particle size of the past solid raw material and the initial particle size of the next solid raw material are different from each other.

* * * * *